(12) United States Patent
Pandher et al.

(10) Patent No.: US 8,994,689 B2
(45) Date of Patent: Mar. 31, 2015

(54) AUTOMOTIVE VEHICLE POWER WINDOW CONTROL USING CAPACITIVE SWITCHES

(71) Applicants: Karamjit K Pandher, Macomb, MI (US); Mark Grimes, Leonard, MI (US)

(72) Inventors: Karamjit K Pandher, Macomb, MI (US); Mark Grimes, Leonard, MI (US)

(73) Assignee: Chrysler Group LLC, Auburn Hills, MI (US)

( * ) Notice: Subject to any disclaimer, the term of this patent is extended or adjusted under 35 U.S.C. 154(b) by 110 days.

(21) Appl. No.: 13/743,801

(22) Filed: Jan. 17, 2013

(65) Prior Publication Data

US 2013/0187889 A1    Jul. 25, 2013

Related U.S. Application Data

(60) Provisional application No. 61/590,538, filed on Jan. 25, 2012.

(51) Int. Cl.
*G06F 3/045* (2006.01)
*B60R 22/00* (2006.01)
(Continued)

(52) U.S. Cl.
CPC ............ *G06F 3/044* (2013.01); *E05F 15/1684* (2013.01); *H03K 17/962* (2013.01); *H03K 17/9622* (2013.01); *E05F 15/0008* (2013.01); *G06F 3/017* (2013.01); *B60J 1/17* (2013.01); *E05F 15/00* (2013.01); *E05Y 2400/42* (2013.01); *E05Y 2400/86* (2013.01); *E05Y 2800/424* (2013.01); *E05Y 2400/852* (2013.01); *E05Y 2800/73* (2013.01); *E05Y 2900/55* (2013.01); *H03K 2217/94052* (2013.01); *E05Y 2400/854* (2013.01); *E05Y 2800/426* (2013.01)
USPC ............................................ 345/174; 701/49

(58) Field of Classification Search
CPC ................................... G06F 3/017; B60J 1/17
USPC .............................. 345/174; 340/438; 701/49
See application file for complete search history.

(56) References Cited

U.S. PATENT DOCUMENTS 5,857,061 A    1/1999   Chang et al.
6,437,270 B1 *  8/2002  Morrison et al. ............. 200/520

FOREIGN PATENT DOCUMENTS

EP    1327860 A2       7/2003
EP    1978535 A2 *    10/2008    ............. H01H 13/70
GB    2418741 A        4/2006

OTHER PUBLICATIONS

Chrysler 300 Owner's Manual (2010 Model, published 2009) Title page & pp. 37-39.*

(Continued)

*Primary Examiner* — Dwayne Bost
*Assistant Examiner* — Larry Sternbane
(74) *Attorney, Agent, or Firm* — Ralph E Smith

(57) ABSTRACT

A capacitive switch assembly for controlling power windows of an automotive vehicle has a plurality of window select capacitive sensors with a respective window select capacitive sensor for selecting a respective power window to be opened or closed. The capacitive switch assembly also includes a capacitive actuator including gesture responsive capacitive sensors responsive to an open gesture and a close gesture made by a user with a finger on a gesture pad of the capacitive actuator. The gesture responsive capacitive sensors are located at locations on the gesture pad so that the open and close gestures mimic the way in which a user moves an actuator of a mechanical switch to open and close a window. The capacitive switch assembly may include a hot button that enables and disables the power windows.

5 Claims, 4 Drawing Sheets

(51) Int. Cl.
- *E05F 15/00* (2006.01)
- *G05D 1/00* (2006.01)
- *G05D 3/00* (2006.01)
- *G06F 7/00* (2006.01)
- *G06F 17/00* (2006.01)
- *G06F 3/044* (2006.01)
- *E05F 15/16* (2006.01)
- *H03K 17/96* (2006.01)
- *G06F 3/01* (2006.01)
- *B60J 1/17* (2006.01)

(56) References Cited

OTHER PUBLICATIONS

International Search Report dated Apr. 10, 2013 for International Application No. PCT/US2013/022630, International Filing Date Jan. 23, 2013.

Written Opinion dated Apr. 10, 2013 for International Application No. PCT/US2013/022630, International Filing Date Jan. 23, 2013.

* cited by examiner

AUTOMOTIVE VEHICLE POWER WINDOW CONTROL USING CAPACITIVE SWITCHES

CROSS REFERENCE TO RELATED APPLICATION

This application claims priority from U.S. Provisional Ser. No. 61/950,538, filed Jan. 25, 2012.

FIELD

The present invention relates to the control of power windows in automotive vehicles where capacitive switches are used to actuate the up and down movement of the power windows.

BACKGROUND

Power windows are often used in automotive vehicles. A power window as used herein means a window assembly in a door of an automotive vehicle where the window glass is moved up and down by a power window regulator assembly. A window regulator in a window assembly in a door of an automotive vehicle is a mechanism that moves the window up and down. In a power window, the window regulator is driven by an electrical actuator that drives the mechanism to move the window up and down. The electrical actuator is actuated by switch. The typical switch is a three position, return to center mechanically actuated momentary switch with the center position being one of the three positions. A switch actuator moved by a user closes first and second contacts of the switch that connects electrical power to the electrical actuator to cause the electrical actuator to move the window up or down. For example, when the electrical actuator includes and electrical motor, the first and second contacts of the switch connect the electrical power to the motor in a polarity to cause the motor to rotate in one direction to move the window up and connects the electrical power to the motor in an opposed polarity to cause the motor to rotate in the opposite direction to move the window down.

Another type of switch often used in consumer devices is a capacitive switch. A capacitive switch responds to a change in capacitance caused by a user touching the switch such as with a finger which results in a change in a signal level output by the capacitive switch. This change in signal level is, for example, sensed by controller to which the capacitive switch is coupled. The controller then takes the appropriate action.

In using a capacitive switch to control the actuation of power windows in automotive vehicles it would be desirable to prevent inadvertent activation of the switch such as might be caused by an occupant of the vehicle inadvertently touching the capacitive switch, such as by resting a hand on the capacitive switch. It would also be desirable to have an arrangement of capacitive switches having a single switch actuator that is used to select up and down movement for each of the power windows in the vehicle.

SUMMARY

In accordance with an aspect of the present disclosure, a capacitive switch assembly for controlling power windows of an automotive vehicle has a plurality of window select capacitive sensors with a respective window select capacitive sensor for selecting a respective power window to be opened or closed. The capacitive switch assembly also includes a capacitive actuator including gesture responsive capacitive sensors responsive to an open gesture and a close gesture made by a user with a finger on a gesture pad of the capacitive actuator. The gesture responsive capacitive sensors are located at locations on the gesture pad so that the open gesture is a mimic open gesture that mimics the way in which a user moves a mechanical switch to open a window and the close gesture is a mimic close gesture that mimics the way in which a user moves a mechanical switch to close a window. A controller is responsive to the window select capacitive sensors and the gesture responsive capacitive sensors and actuating the selected power window to open that power window in response to the gesture being an open gesture and to close that power window in response to the gesture being a close gesture.

In an aspect of the present disclosure, the gesture responsive capacitive sensors include window open capacitive sensors and window close capacitive sensors. In an aspect of the present disclosure, the gesture pad includes a recess in which the open and close gestures are made.

In an aspect of the present disclosure, the controller is responsive to express and manual open and close gestures. The controller responds to an express open or close gesture to fully open or close the selected power window regardless of whether the user holds the gesture on the finger pad at the completion of the gesture and responds to a tap of the user's finger on the gesture pad by stopping movement of the selected power window. The controller responds to a manual open or close gesture by actuating the power window to open or close it as long as the user is holding the finger making the gesture on the finger pad at the completion of the gesture and stops actuation of the selected power window in response to the user releasing the gesture by removing the finger making the gesture from the gesture pad.

In an aspect of the present disclosure, the capacitive switch assembly includes a hot button and the controller is responsive to each actuation of the hot button to toggle between an enable and a disable state wherein when in a disable state, the controller does not actuate the power windows in response to actuation of the window select capacitive sensors or the capacitive actuator. In an aspect of the present disclosure, the hot button is spaced from the window select capacitive sensors and capacitive actuator at least 60 mm.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

DETAILED DESCRIPTION

Figure 1:
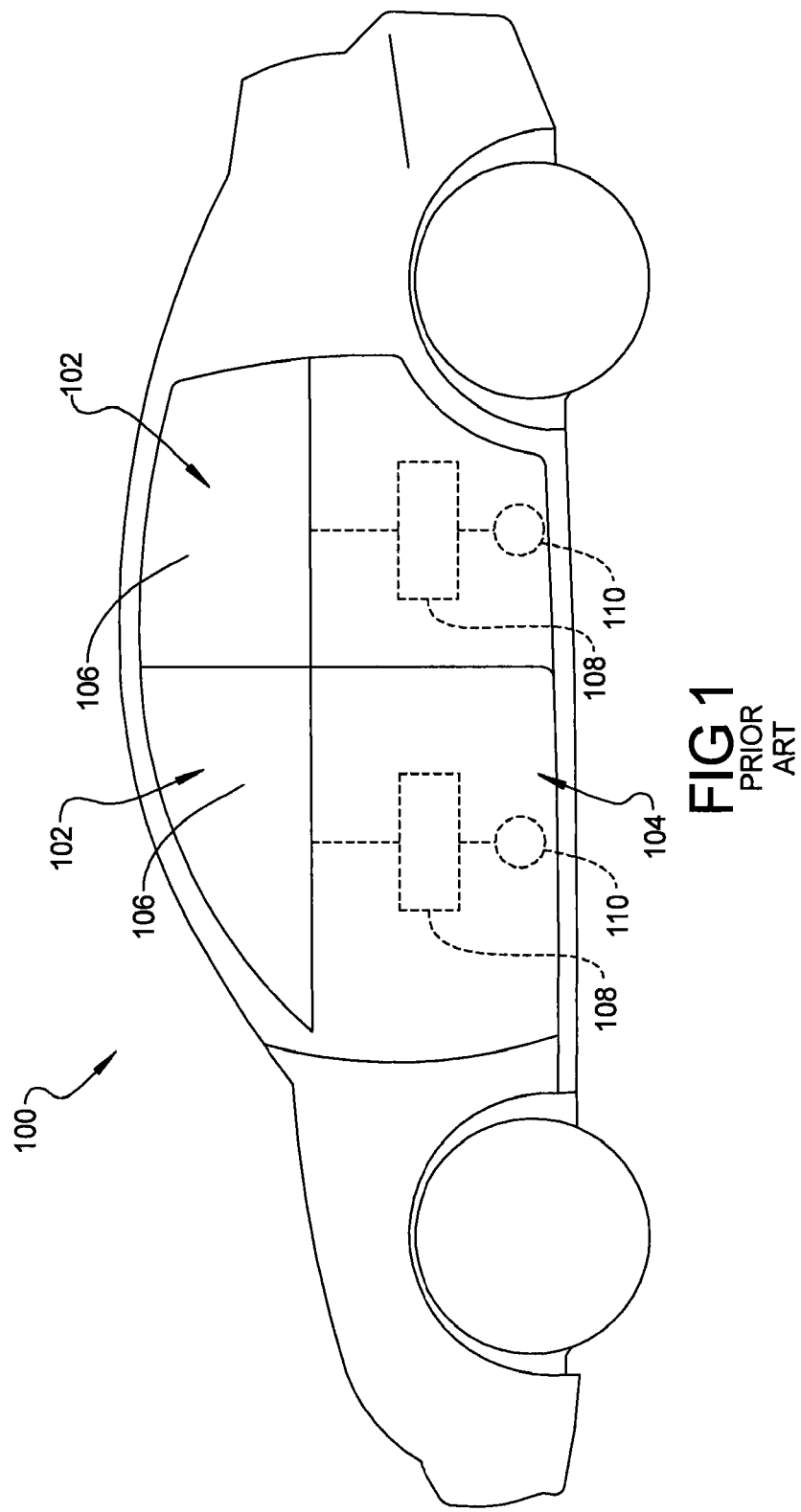
FIG. 1 is a simplified side elevation of a prior art automotive vehicle having power windows.

FIG. 1 is a simplified illustration of a prior art automotive vehicle 100 having power windows 102 in each of the doors 104 of the vehicle, such as the four doors 104 of the automotive vehicle 100, only two of which are shown in FIG. 1. The power windows each have a window glass 106, a window regulator 108 coupled to the window glass 106 and an electric motor 110 coupled to the window regulator 108.

Figure 2:
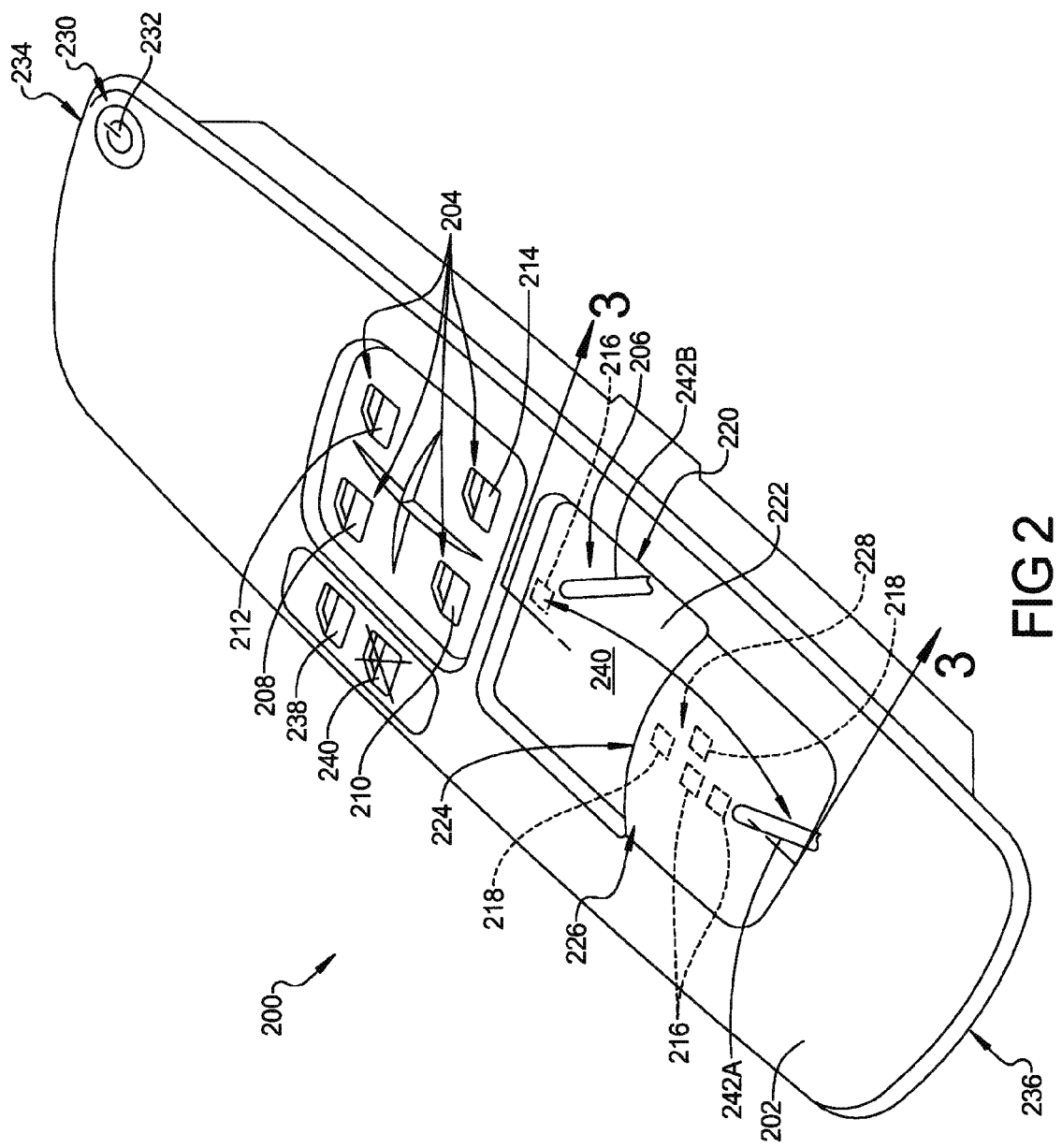
FIG. 2 is a perspective view of a capacitive switch assembly in accordance with an aspect of the present disclosure.
Figure 3:
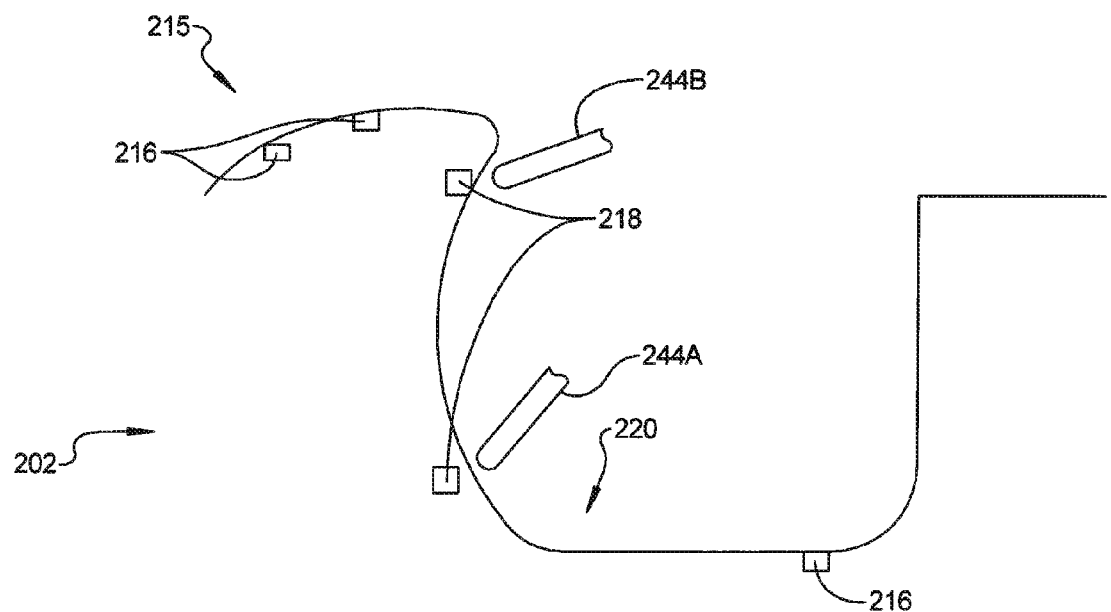
FIG. 3 is a section of the capacitive switch assembly of FIG. 2 taken along the line 3-3 of FIG. 2.

FIGS. 2 and 3 show a capacitive switch assembly 200 in accordance with aspects of the present disclosure for controlling power windows in automotive vehicles such as power windows 102 of automotive vehicle 100 (FIG. 1). Capacitive switch assembly may illustratively be part of an arm rest 202 of a driver side front door, such as the door 104 in automotive vehicle 100 that is the driver side front door.

Capacitive switch assembly 200 includes a window select capacitive sensor 204 for each power window that selects which power window is being actuated, and a capacitive window actuator 206 that responds to finger gestures to actuate the movement of the selected power window up or down, depending on the finger gesture. Capacitive switch assembly 200 may also include a "hot button" capacitive sensor for enabling and disabling the power windows 102.

In the example embodiment shown in FIGS. 1-3, automotive vehicle 100 has four power windows, one in each of its four doors. These doors are the driver side front door, the driver side rear door, the front passenger side door and the rear passenger side door. Capacitive switch assembly 200 thus has four window select capacitive sensors 204, driver side front door window select capacitive sensor 208, driver side rear door window select capacitive sensor 210, passenger side front door window select capacitive sensor 212, and passenger side rear door power window select capacitive sensor 214. Window unlock and lock capacitive sensors 238,240 are illustratively provided that are used to toggle actuation of the power windows from the passenger doors of the vehicle between a lock and unlock state lock, comparable in function to the mechanical window unlock/lock switch conventionally used in vehicles. That is, when in a lock state, the power windows cannot be actuated from the passenger doors of the vehicle and the switch is used to toggle between the lock state and an unlock state.

As best shown in FIG. 3, capacitive window actuator 206 includes gesture responsive capacitive sensors 215. Gesture responsive capacitive sensors 215 are responsive to open and close gestures made by a user with a finger on a gesture pad 220 (FIG. 2) of capacitive window actuator 206. Gesture pad 220 may illustratively include a curved recess 222 in arm rest 202 of the door 104 that is the driver side front door. The gesture responsive capacitive sensors are arranged at locations of gesture pad 220 so that an open gesture is a mimic open gesture that mimics the way in which a user moves a mechanical switch actuator to open a window and the close gesture is a mimic close gesture that mimics the way in which a user moves a mechanical switch actuator to close the window. In an example, the mimic open gesture mimics a push forward of a mechanical switch actuator and the mimic close gesture mimics a pull back of a mechanical switch actuator. In another example, the directions are reversed and the mimic open gesture mimics a pull back of a mechanical switch actuator and the mimic close gesture mimics a push forward of a mechanical switch actuator.

In the embodiment shown in FIG. 3, gesture responsive capacitive sensors 215 include "open" capacitive sensors 216 and "close" capacitive sensors 218. Open capacitive sensors 216 illustratively include open capacitive sensors 216, two located in-line with each other at center of gesture pad 220 rearwardly of recess 222 and one at a front center of recess 222. Close capacitive sensors 218 illustratively include two close capacitive sensors 218, one located at a bottom, rear center 228 of recess 222 of gesture pad 220 and the other located vertically above the first at a top, rear center 224 of recess 222.

In the aspect that includes a "hot button" 230, a capacitive sensor 232 is located in an area of arm rest 202 that is sufficiently far from window select capacitive sensors 204 and capacitive window actuator 206 that a user inadvertently resting a hand on arm rest 202 would not contact both capacitive sensor 232 and any of the window select capacitive sensors 204 or capacitive window actuator 206. In the example embodiment shown in FIG. 2, capacitive sensor 232 is located at the front right 234 of arm rest 202. It should be understood that capacitive sensor 232 that provides hot button 230 can be located in other locations of arm rest 202, such as the back end 236 of arm rest 202, or even remote from arm rest 202, as long as it is spaced sufficiently from window select capacitive sensors 204 and capacitive window actuator 206 that a hand resting on arm rest 202 would be unlikely to contact capacitive sensor 232 as well as any of window select capacitive sensors 204 or switch actuator 206. The distance that capacitive sensor 232 is spaced from any of window select capacitive sensors 204 and capacitive actuator 206 is at least 60 mm. As used herein, "hot button" means a switch, such as capacitive sensor 232, that is used to enable and disable the power windows.

Figure 4:
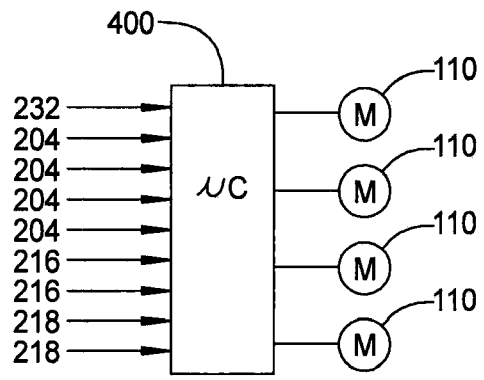
FIG. 4 is a simplified schematic of a controller of the capacitive switch assembly of FIG. 2.

In an illustrative embodiment shown in FIG. 4, window select capacitive sensors 204, "open" capacitive sensors 216, "close" capacitive sensors 218, and capacitive sensor 232 that provides hot button 230 are coupled to inputs of a controller 400. Outputs of controller 400 are coupled to motors 110 of power windows 102. It should be understood that controller 400 could be a separate controller, or could be incorporated in another controller utilized in automotive vehicle 100, such as a body controller. Controller 400 may be a microcontroller, but may also be other electronic devices, such as an ASIC, microprocessor, or discrete digital logic integrated circuits.

In operation, a user, such as a driver of a vehicle, selects which power window 102 to open or close by tapping with a finger the window select capacitive sensor 204 for that power window 102. The user then makes the appropriate gesture with a finger on gesture pad 220 to open or close the window. As discussed above, the open gesture is illustratively a gesture that mimics pushing a mechanical switch actuator forward and may for example be a gesture that a user makes by placing a finger at "open" capacitive sensor 216 toward the rear of gesture pad 220 and then sweeping the finger along the surface 240 of gesture pad 220 to "open" capacitive sensor 216 at the bottom front center of recess 222 of gesture pad 220. The start point of the open gesture is shown by finger icon 242A in FIG. 2 and the ending point of the open gesture is shown by finger icon 242B. Also as discussed above, the close gesture may for example be a gesture that mimics pulling a mechanical switch actuator back and may for example be a gesture that a user makes by placing a finger at "close" capacitive sensor 218 at the bottom rear center 228 of recess 222 of gesture pad 220 and sweeping the finger along the surface 240 of gesture pad 220 to the "close" capacitive sensor 218 located at the top rear center 224 of gesture pad 220. The starting point of the close gesture is shown by finger icon 244A in FIG. 3 and the ending point of the close gesture is shown by finger icon 244B in FIG. 3

When the user makes the "open" gesture, controller 400 responds to signals from "open" capacitive sensors 216 triggered by the swipe of the finger over them and the window select capacitive sensor 204 tapped by the user and actuates the motor 110 of the selected power window 102 to open that power window 102. When the user makes the "close" gesture, controller 400 responds to signals from "close" capacitive sensors 218 triggered by the passage of the finger over them and the window select capacitive sensor 204 tapped by the user and actuates the motor 110 of the selected power window 102 to close that power window 102.

Both an express mode and a manual mode may be implemented, such as in programming of controller 400. In an illustrative embodiment, the express gesture is a gesture made by the user with a finger on the gesture pad and at the end of the gesture, immediately removing the finger from the gesture pad. In this illustrative embodiment, the manual gesture is a gesture made by the user with a finger on the gesture pad and then keeping the finger on the gesture pad at the end of the gesture. In the express mode, once the user makes an open or close gesture, the selected power window 102 is actuated to move it to its full up or down position. The user may then tap the gesture pad 220 to stop the movement of the selected power window 102. In the manual mode, the user makes the open or close gesture and then holds the user's finger on the gesture pad at the end of the gesture to keep the selected power window opening or closing. If the user removes the user's finger in the manual mode, the selected power window 102 then stops moving.

In an aspect that includes hot button 230, a user taps capacitive sensor 232 to enable and disable the power windows 102. Each tap toggles the power windows 102 between the enable and disable states. In an illustrative embodiment, controller 400 responds to each tap of the capacitive sensor 232 and toggles the power windows 102 between the enable and disable states. When the power windows 102 are disabled, controller 400 ignores any signals from window select capacitive sensors 204, "open" capacitive sensors 216 and "close" capacitive sensors 218 and does not open or close any power window 102. When the power windows 102 are enabled, controller 400 opens and closes the selected power window 102 as discussed above.

Figure 5:
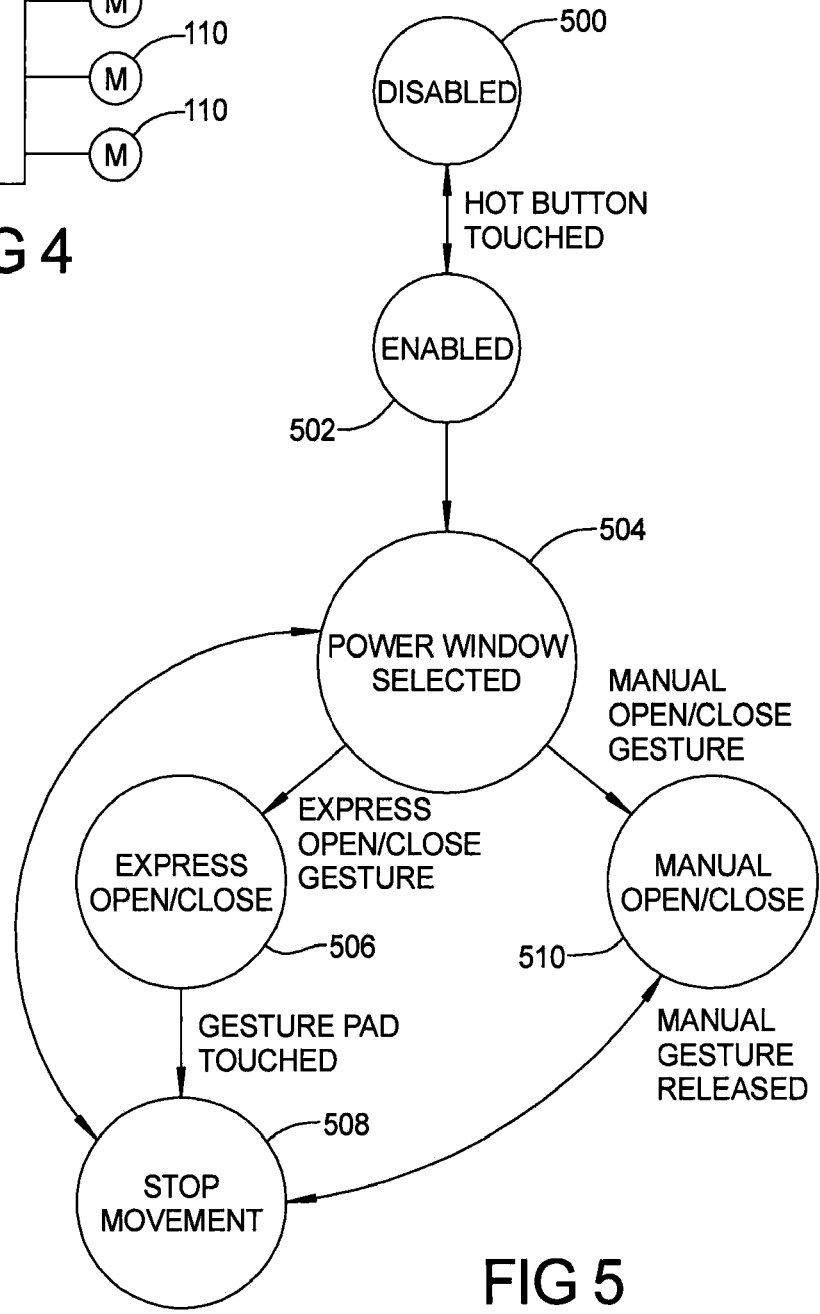
FIG. 5 is a simplified state diagram of illustrative logic implemented in the controller of FIG. 4.

FIG. 5 is a simplified state diagram of illustrative logic implementing the above. Controller 400 may illustratively be a programmable device, such as a microcontroller, and the logic implemented in software programmed in controller 400. Controller 400 may also be a device such as an ASIC in which the above logic is implemented.

With reference to FIG. 5, controller 400 transitions between the power window disabled state 500 and power window enabled state 502 when hot button 230 is touched. When in the power window enabled state 502, controller 400 transitions to the power window selected state 504 when one of window select capacitive sensors 204 is touched. When in the power window selected state 504, controller 400 transitions to the express open/close state 506 when an express open or close gesture is made, or to the manual open/close state 510 when a manual raise or lower gesture is made. In the express open/close state 506, controller 400 actuates the motor 110 of the selected power window 102 to fully open or close the selected power window 102, depending on whether an open or close gesture is made. When in the express open/close state 506, controller 400 will if the gesture pad 220 is touched, transition to the stop movement state 508 if the gesture pad 220 is touched. In the stop movement state 508, controller 400 de-energizes the motor 110 for the selected power window 102 to stop the movement of the selected power window 102.

In the manual open/close state 510, controller 400 actuates the motor 110 of the selected power window 102 to open or close the selected power window 102, depending on whether an open or close gesture is made. When in the manual open/close state 510, controller 400 will if the gesture is released, that is, the user's finger is removed from gesture pad 220, transition to the stop movement state 508. In the stop movement state 508, controller 400 de-energizes the motor 110 for the selected power window 102 to stop the movement of the selected power window.

What is claimed is:

1. A capacitive switch assembly for controlling power windows of an automotive vehicle, comprising
a plurality of window select capacitive sensors with a respective window select capacitive sensor for selecting a respective power window to be opened or closed; and
a capacitive actuator including gesture responsive capacitive sensors responsive to an open gesture and a close gesture made by a user with a finger on a gesture pad of the capacitive actuator, the gesture responsive capacitive sensors located at locations on the gesture pad so that the open gesture is a mimic open gesture that mimics the way in which a user moves a mechanical switch to open a window and the close gesture is a mimic close gesture that mimics the way in which a user moves a mechanical switch to close a window;
a controller responsive to the window select capacitive sensors and the gesture responsive capacitive sensors and actuating the selected power window to open that power window in response to the gesture being an open gesture and to close that power window in response to the gesture being a close gesture; and
a hot button wherein the controller is responsive to each actuation of the hot button to toggle between an enable and a disable state wherein when in the disable state, the controller disables actuation of the power windows in response to a signal from any of the gesture responsive capacitive sensors.

2. The capacitive switch assembly of claim 1 wherein the gesture responsive capacitive sensors include window open capacitive sensors and window close capacitive sensors.

3. The capacitive switch assembly of claim 2 wherein the gesture pad includes a recess in which the open and close gestures are made.

4. The capacitive switch assembly of claim 1 wherein the controller is responsive to an express open or close gesture to fully open or close the selected power window regardless of whether the user holds the gesture on the gesture pad at the completion of the gesture and responds to a tap of the user's finger on the gesture pad by stopping movement of the selected power window, and is responsive to a manual open or close gesture by actuating the power window to open or close it as long as the user is holding the finger making the gesture on the finger pad at the completion of the gesture and stops actuation of the selected power window in response to the user releasing the gesture by removing the finger making the gesture from the gesture pad.

5. The capacitive switch assembly of claim 1 wherein the hot button is spaced from the window select capacitive sensors and capacitive actuator at least 60 mm.

* * * * *